United States Patent [19]

Suzuki

[11] Patent Number: 4,692,836

[45] Date of Patent: Sep. 8, 1987

[54] ELECTROSTATIC CHUCKS

[75] Inventor: Yoshio Suzuki, Numazu, Japan

[73] Assignee: Toshiba Kikai Kabushiki Kaisha, Tokyo, Japan

[21] Appl. No.: 664,408

[22] Filed: Oct. 24, 1984

[30] Foreign Application Priority Data

Oct. 31, 1983 [JP] Japan .............................. 58-204239
Oct. 31, 1983 [JP] Japan .............................. 58-204240
Oct. 31, 1983 [JP] Japan .............................. 58-204241

[51] Int. Cl.$^4$ .......................................... H01T 20/00
[52] U.S. Cl. ................................................ 361/234
[58] Field of Search ..................... 361/234; 250/492.2

[56] References Cited

U.S. PATENT DOCUMENTS 4,384,918  5/1983  Abe .................................. 361/234 X
4,520,421  5/1985  Sakitani et al. ..................... 361/234

Primary Examiner—L. T. Hix
Assistant Examiner—D. Rutledge
Attorney, Agent, or Firm—Stevens, Davis, Miller & Mosher

[57] ABSTRACT

In an electrostatic chuck of the type wherein an electrode is covered by an insulating dielectric member, an object, typically a semiconductor wafer, to be electrostatically attracted is mounted on the dielectric member, and a potential difference is applied across the wafer and the electrode, the electrode is shaped such that the distribution of the electrostatic attractive force applied to the wafer would not be uniform throughout the attractive surface of the chuck. To this end the electrode is constituted by a plurality of spaced rings or bars or provided with a plurality of circumferentially spaced radial members. When the wafer is flexed downwardly, the thickness of the dielectric member is varied continuously from one to the other end. Where the electrode is divided into a plurality of split electrodes, variable resistors are provided to apply the same or different DC voltages to the split electrodes.

9 Claims, 13 Drawing Figures

FIG. 1 PRIOR ART
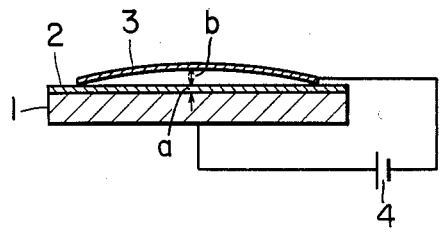
FIG. 2 PRIOR ART
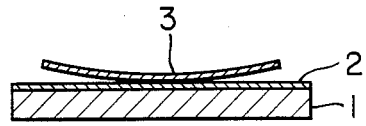
FIG. 3 PRIOR ART
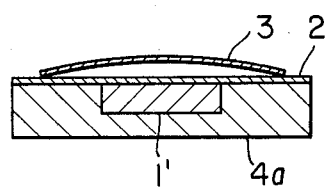
FIG. 4 PRIOR ART
FIG. 5
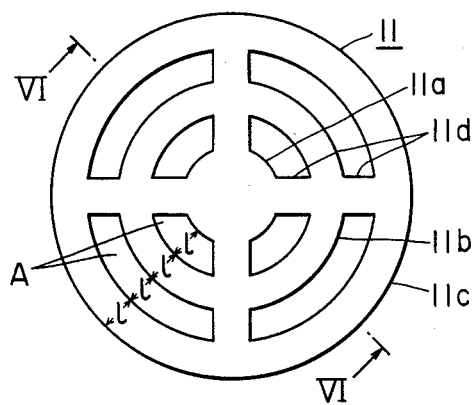
FIG. 6
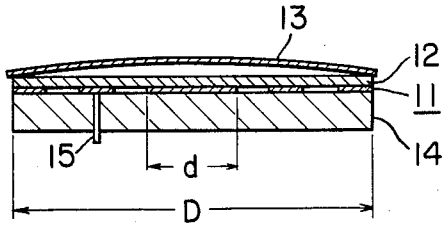

ELECTROSTATIC CHUCKS

BACKGROUND OF THE INVENTION

This invention relates to an electrostatic chuck and more particularly to an electrostatic chuck capable of securely holding, in a flat configuration, such object to be chucked or attracted as a semiconductor wafer (hereinafter called a wafer) which inherently flexes upwardly or downwardly.

As shown in FIG. 1, a prior art electrostatic chuck comprises a flat plate shaped electrode 1, and a thin insulating dielectric film 2 applied on the surface of the electrode 1. A thin semiconductor wafer 3 is mounted on the surface of the dielectric film 2 and a high DC voltage is applied across the wafer 3 and the electrode 1 from a source 4 to electrostatically attract the wafer 3 against the surface of the dielectric film 2.

Recently, a silicon rod is expitaxially grown by vapor phase growing technique and thin silicon wafers are prepared by slicing the silicon rod and then polishing. Since the wafer is thin and has a diameter of 10 cm or more, the wafer is not perfectly flat and usually flexes more or less upwardly or downwardly. In other words, the wafer is concave or convex so that it is difficult to attract the wafer against the surface of the dielectric film in perfectly flat state. The attractive force of the electrostatic chuck is expressed by the following equation:

$$f = k \frac{n^2 V^2}{(o + nb)^2}$$

where K is a constant, n the dielectric constant of the dielectric film 2, V the voltage impressed across the electrode 1 and the wafer 3, a the thickness of the dielectric film 2, and b the gap between the dielectric film 2 and wafer 3.

As can be noted from this equation the attractive force f increases as the gap b decreases. Accordingly, when the wafer 3 is concave as shown in FIG. 2, there is no problem, but when the wafer is convex as shown in FIG. 3 or its central portion projects upwardly than the peripheral portion as shown in FIG. 3, as the peripheral portion is close or in direct contact with the surface of the dielectric film 2, the peripheral portion would firstly be attracted and secured, and the central portion of the wafer would then be attracted. For this reason, the peripheral portion must slide outwardly. However, since the peripheral portion has already been firmly attracted, it cannot slide outwardly, thus failing to bring the central portion of the wafer into firm contact in a flat state. In other words, it is impossible to correct the flexure of the wafer 3. The result of the inventor's experiment showed that, when the wafer is convex as shown in FIG. 1, the flexing of the wafer can be removed by causing electrode 1' to oppose only the central portion of the wafer 3 as shown in FIG. 3. However, such electrostatic chuck cannot attract in a flat state a concave wafer 3 as shown in FIG. 4. In FIGS. 3 and 4, reference character 4A designates an insulating substrate.

SUMMARY OF THE INVENTION

It is an object of the invention to provide an improved electrostatic chuck capable of attracting and holding in a flat state a wafer irrespective of whether it is flexed upwardly or downwardly.

According to this invention there is provided an electrostatic chuck of the type wherein an electrode is covered by an insulating dielectric member, an object to be electrostatically attracted is mounted on the dielectric member and a potential difference is applied across the object and the electrode, characterized in that the configuration of the electrode is selected such that the distribution of an electrostatic attractive force applied to the object would not be uniform throughout the entire attracting surface of the electrostatic chuck.

This can be accomplished by various means. In one example, the electrode is made up of a plurality of spaced concentric split electrodes, or the electrode comprises a plurality of circumferentially spaced radial members. Alternatively, the thickness of the dielectric member is varied. Variable resistors are provided for applying the same or different DC voltages to respective split electrodes.

BRIEF DESCRIPTION OF THE DRAWINGS

In the accompanying drawings

FIGS. 1 and 2 are sectional views showing a prior art electrostatic chuck and wafers having different shapes;

FIGS. 3 and 4 are sectional views showing an electrostatic chuck utilized in the inventor's experiments and wafers having different shapes;

FIG. 5 is a plan view showing one example of the pattern of the electrode of an electrostatic chuck embodying the invention;

FIG. 6 is a sectional view taken along a line VI—VI in FIG. 5 and showing the relation between the electrostatic chuck and a wafer to be attracted thereby;

DESCRIPTION OF THE PREFERRED EMBODIMENTS

Figure 7:
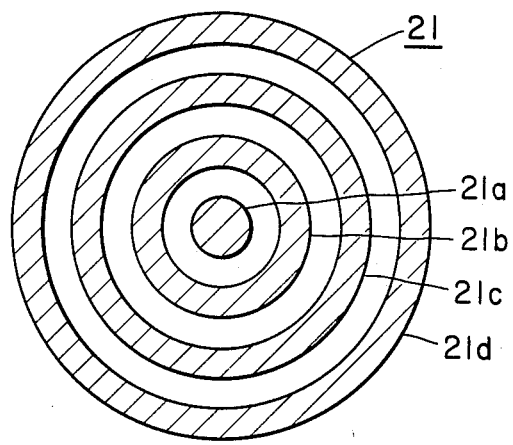
FIGS. 7, 8 and 9 are plan views showing different electrode patterns of the electrostatic chuck embodying the invention.

FIG. 5 shows one example of an electrode 11 according to this invention. It comprises a central circular portion 11a, two annular rings 11b and 11c concentric therewith and radial connecting members 11d which interconnect the central portion and the annular rings. The electrode 11 having a pattern as shown in FIG. 5 is bonded to the upper surface of a ceramics substrate 14, and a dielectric member 12 made of glass, for example, is bonded to the upper surface of the electrode 11. A lead wire 15 is connected to the electrode 11 for applying DC voltage thereto. Assume now that the electrode 11 has an outer diameter D=120 mm, that the central circular portion 11a has a diameter of d=30 mm, and that the annular rings 11b and 11c and vacant or intangible spaces therebetween have equal radial widths 1 as shown in FIG. 5.

A semiconductor wafer having a diameter of 125 mm was mounted on the surface of the dielectric member 12 of an electrostatic chuck having an electrode as shown in FIG. 5, and DC voltage of 400 V was applied across the electrode 11 and wafer 13. Then a semiconductor wafer having a central portion about 30μ higher than the peripheral portion was made substantially flat, that is flexure thereof was corrected. In a case where the electrode 11 extends over the entire surface of the chuck, the difference in the height was about 15μ.

With the electrostatic chuck of this invention a wafer flexing in a direction opposite to that shown in FIG. 6 can be more readily flattened.

Figure 8:
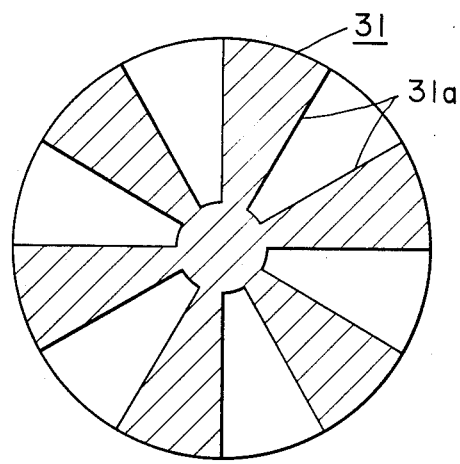
Figure 9:
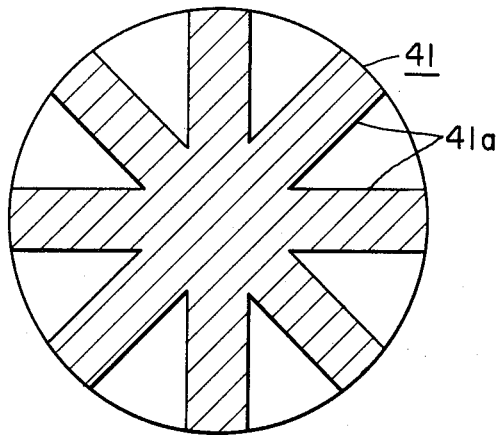

FIGS. 7-9 show modified electrode patterns. In FIG. 7 an electrode 21 is constituted by a central circular portion 21a and three annular rings 21b, 21c and 21d concentric therewith which are not electrically interconnected as in the embodiment shown in FIG. 5. In FIGS. 8 and 9 the electrodes 31 and 41 are constituted by a plurality of radially extending members 31a and 41a respectively. Members 31a have a width increasing from the central portion, while members 41a have a constant width. As shown in FIG. 9 when the electrode is constructed such that its area is wide at the central portion and reduces toward the periphery, a wafer whose height is large at the central portion as shown in FIG. 6 can be completely flattened.

Figure 10:
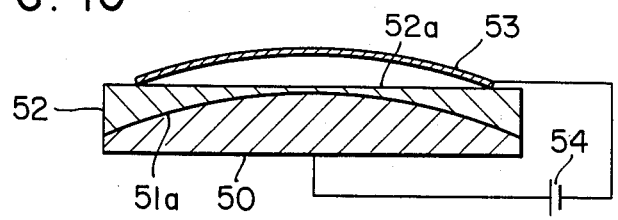
FIGS. 10, 11 and 12 are sectional views of the electrostatic chuck and a wafer wherein the sectional configurations of the insulating dielectric member and the electrode are changed variously.
Figure 11:
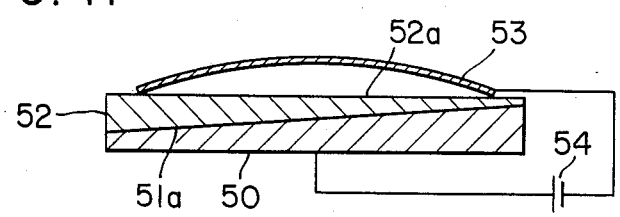
Figure 12:
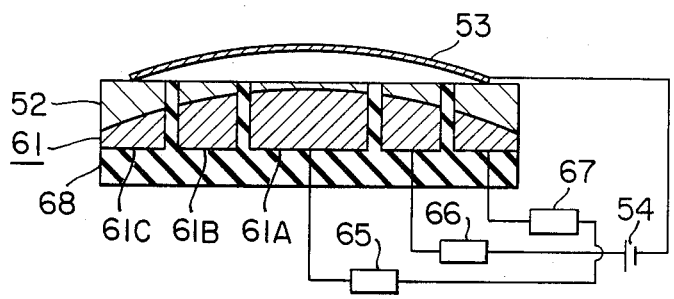

In other embodiments shown in FIGS. 10, 11 and 12, the distance between the surface of a dielectric film or member and the surface of the electrode is varied for attracting in a more flat state a flexed wafer. By selecting a suitable surface configuration for the electrode, the distribution of the attractive force can be determined as desired according to the variation in the distance. In the embodiment shown in FIG. 10, the upper surface of the electrode 50 is made spherical so as to firmly attract a flexed wafer 53 against the surface 52a of the dielectric member 52 by an electrostatic force created by DC potential applied across the electrode 50 and the wafer 55 from a DC source 54. The spherical surface 51a of the electrode 50 is contoured such that the distance between the electrode surface 51a and the upper surface 52a of the dielectric member 52 is the shortest at the center and gradually increases toward the periphery. In other words, the thickness of the dielectric member 12 is the smallest at the central portion and increases toward the periphery.

The thickness distribution of the dielectric member 52 is determined such that the attractive force f calculated by the above described equation would act substantially uniformly upon various portions of the wafer 53 by taking into consideration the amount of flexure thereof anticipatable by experience. In other words, the thickness distribution is determined such that the surface configuration of the electrode 50 substantially coincides with the expected flexed configuration of the wafer 53, or that a strong attractive force will be applied to the central portion of the wafer or that the relative magnitude of the attractive force at the central portion and the periphery is selected to permit the peripheral portion of the wafer to slide on the surface 52a of the dielectric member 52 when the central portion of the wafer is attracted into contact with the dielectric member 52.

With this embodiment, since the upper surface of the electrode is spherical to conform with the lower surface of a flexed wafer, the difference in the distance between the wafer and the electrode can be made substantially constant over the entire inner surface of the wafer. Consequently, a problem in which the peripheral portion is firstly attracted strongly to prevent attraction of the central portion can be obviated. In other words, the wafer is attracted over its entire surface to correct flexure of the wafer.

FIG. 11 shows another embodiment of this invention, in which the upper surface 51a of the electrode 50 is inclined and the lower surface of the dielectric member 52 is also inclined. Thus both the electrode 50 and the member 52 have wedge shaped configuration. With this construction the righthand end of the wafer 53 is firstly attracted where the thickness of the dielectric member is the smallest and the lefthand end would be attracted while sliding along the upper surface 52a of the dielectric member. In the embodiments shown in FIGS. 10 and 11 it is advantageous to gradually increase the DC voltage impressed across the wafer and the electrode.

In still another embodiment shown in FIG. 12, although the upper surface of an electrode assembly 61 is generally spherical as in FIG. 11, the electrodes assembly 61 is constituted by a central electrode 61A and two outer electrodes 61B and 61C concentrically surrounding the central electrode 61A. In this case, the outer electrodes may be annular or polygonal. Alternatively, these electrodes can be constituted by a plurality of parallel conductive bars. To insulate adjacent electrodes from each other and to support them it is advantageous to embed the electrodes in an insulating base 68. The electrodes 61A, 61B and 61C are connected to a common DC source 54 respectively through variable resistors 65, 66 and 67. These resistors are adjusted such that at the time of starting the same voltage would be applied to all electrodes, but after completion of the attraction the voltage would be increased from the central electrode 61A toward the outermost electrode 61C.

Figure 13:
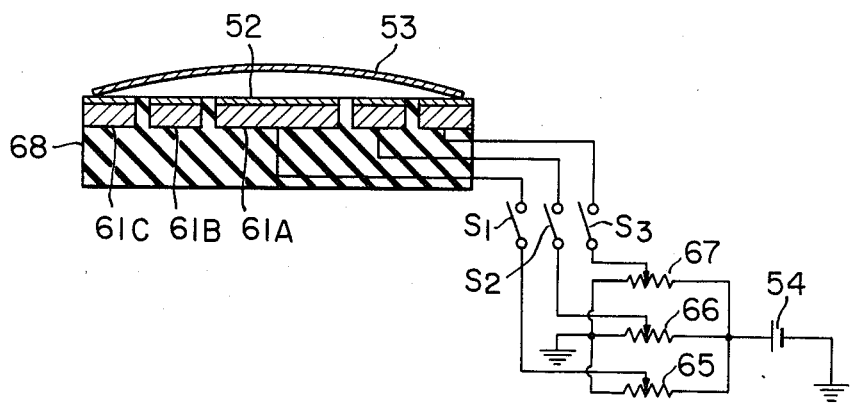
FIG. 13 shows a modification of the electrostatic chuck shown in FIG. 12 in which DC voltages applied to respective split electrodes can be changed in predetermined patterns.

FIG. 13 shows a modification of the embodiment shown in FIG. 12. In FIG. 13 switches $S_1$, $S_2$ and $S_3$ are provided for the purpose of applying DC voltage to split electrodes 61A-61C in a manner to be described later. In this case, since each of the dielectric member 52 and the split electrodes 61A-61C has a unifrom thickness, the method of applying the DC voltage is different from that of FIG. 12. More particularly, at first the DC voltage is applied to the central electrode 61A by closing switch $S_1$ to attract the flexed central portion of the wafer 53. At this time, since outer electrodes 61B and 61C are not energized the peripheral portion of the wafer can slide outwardly along the upper surface of the dielectric member 52 thus firmly attracting the wafer in a flat state. Then intermediate electrode 61B and outer electrode 61C are sequentially energized by sequentially closing switches $S_2$ and $S_3$. Resistors 65-67 can be adjusted such that the highest voltage would be applied to the central electrode 61A and that the voltage decreases toward the periphery. This is necessary because the wafer is flexed downwardly.

I claim:

1. In an electrostatic chuck of the type wherein an electrode is covered by an insulating dielectric member, an object to be electrostatically attracted is mounted on said dielectric member and a potential difference is applied across said object and said electrode,
the improvement wherein said electrode is constituted by a solid electroconductive portion and an intangible portion which are arranged so as to make non-uniform a distribution of an electrostatic attractive force applied to said object, wherein said solid electroconductive portion of said electrode comprises a central portion and a plurality of radially spaced annular portions concentric therewith, and wherein said central portion and said annular portions are electrically interconnected by a plurality of circumferentially spaced radially extending electroconductive members.

2. In an electrostatic chuck of the type wherein an electrode is covered by an insulating dielectric member, an object to be electrostatically attracted is mounted on said dielectric member and a potential difference is applied across said object and said electrode, the improvement wherein said electrode is constituted by a solid electroconductive portion and an intangible portion which are arranged so as to make non-uniform a distribution of electrostatic attractive force applied to said object and wherein said electroconductive portion of said electrode comprises a central portion and the plurality of circumferentially spaced portions extending in radial directions from said central portion.

3. The electrostatic chuck according to claim 2, wherein a circumferential width of each of said circumferentially spaced portions gradually increases from said central portion toward a peripheral portion of said electrode.

4. The electrostatic chuck according to claim 2, wherein each of said circumferentially spaced portions has constant circumferential width throughout the radial length thereof.

5. In an electrostatic chuck of the type wherein an electrode is covered by an insulating dielectric member, an object to be electrostatically attracted is mounted on said dielectric member and a potential difference is applied across said object and said electrode, the improvement wherein said electrode comprises a central portion and a plurality of circumferentially spaced portions extending in radial directions from said central portion and wherein circumferential spacings between said radially extending portions gradually increase from said central portion toward an outer periphery of said electrode.

6. In an electrostatic chuck of the type wherein an electrode is covered by an insulating dielectric member, an object to be electrostatically attracted is mounted on said dielectric member and a potential difference is applied across said object and said electrode, the improvement wherein the thickness of said insulating member is not uniform and distribution of electrostatic force applied to said object is not uniform and wherein said electrostatic attractive force is relatively strong at one side of the surface of said dielectric member and relatively weak at the other side.

7. In an electrostatic chuck of the type wherein an electrode is covered by an insulating dielectric member, an object to be electrostatically attracted is mounted on said dielectric member and a potential difference is applied across said object and said electrode, the improvement wherein the thickness of said insulating member is not uniform and distribution of electrostatic force applied to said object is not uniform and wherein the thickness of said insulating dielectric member is relatively small at one end and gradually increases toward the other end.

8. In an electrostatic chuck of the type wherein an electrode is covered by an insulating dielectric member, an object to be electrostatically attracted is mounted on said dielectric member and a potential difference is applied said across said object and said electrode, the improvement wherein the thickness of said insulating member is not unifrom and distribution of electrostatic force applied to said object is not uniform and wherein a surface of said insulating dielectric member in contact with said electrode is substantially spherical.

9. In an electrostatic chuck of the type wherein electrodes are covered by an insulating dielectric member, an object to be electrostatically attracted is mounted on said dielectric member and a potential difference is applied across said object and said electrodes, the improvement wherin said electrodes comprise a plurality of electrically insulated electrodes and wherein said electrodes comprise a central electrode and the plurality of radially spaced annular electrodes concentric therewith.

* * * * *